(12) United States Patent
Murray et al.

(10) Patent No.: US 10,804,147 B2
(45) Date of Patent: Oct. 13, 2020

(54) SEMICONDUCTOR DEVICE WITH REDUCED VIA RESISTANCE

(71) Applicant: TESSERA, INC., San Jose, CA (US)

(72) Inventors: Conal E. Murray, Yorktown Heights, NY (US); Chih-Chao Yang, Glenmont, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 16/689,142

(22) Filed: Nov. 20, 2019

(65) Prior Publication Data

US 2020/0090993 A1  Mar. 19, 2020

Related U.S. Application Data

(60) Continuation of application No. 15/897,526, filed on Feb. 15, 2018, now Pat. No. 10,553,483, which is a
(Continued)

(51) Int. Cl.
*H01L 21/768* (2006.01)
*H01L 23/532* (2006.01)
(Continued)

(52) U.S. Cl.
CPC .......... *H01L 21/76879* (2013.01); *C23F 1/44* (2013.01); *C23F 4/00* (2013.01); *H01L 21/76802* (2013.01); *H01L 21/76805* (2013.01); *H01L 21/76816* (2013.01); *H01L 21/76829* (2013.01); *H01L 21/76832* (2013.01);
(Continued)

(58) Field of Classification Search
CPC ............ H01L 21/76879; H01L 23/528; H01L 21/76897; H01L 21/76805; H01L 21/76829; H01L 21/76849; H01L 21/76816; H01L 21/76834; H01L 21/76844; H01L 23/53223; H01L 23/53238; H01L 23/53266; H01L 23/5329; H01L 23/53295; H01L 23/5226; H01L 23/53228; H01L 21/76802; H01L 21/76832; H01L 21/76846; H01L 23/5283; H01L 2924/0002; H01L 21/76804; C23F 1/44; C23F 4/00
See application file for complete search history.

(56) References Cited

U.S. PATENT DOCUMENTS 5,380,546 A  1/1995  Krishnan
5,695,810 A  12/1997  Dubin
(Continued)

OTHER PUBLICATIONS

IBM Appendix P., "List of IBM Patents or Patent Applications to be Treated as Related", dated Nov. 20, 2019, 2 pages.
(Continued)

*Primary Examiner* — Stephen W Smoot
*Assistant Examiner* — Vicki B. Booker

(57) ABSTRACT

A semiconductor interconnect structure that has a first portion included in an upper interconnect level and a second portion included in a lower interconnect level. The semiconductor interconnect structure has a segment of dielectric capping material that is in contact with the bottom of the first portion, which separates, in part, the upper interconnect level from a lower interconnect level. The second portion is in electrical contact with the first portion.

10 Claims, 5 Drawing Sheets

Related U.S. Application Data continuation of application No. 15/078,066, filed on Mar. 23, 2016, now Pat. No. 9,953,869, which is a division of application No. 14/339,704, filed on Jul. 24, 2014, now Pat. No. 9,349,691.

(51) Int. Cl.

| | | |
|---|---|---|
| *H01L 23/522* | (2006.01) | |
| *H01L 23/528* | (2006.01) | |
| *C23F 4/00* | (2006.01) | |
| *C23F 1/44* | (2006.01) | |

(52) U.S. Cl.
CPC .. *H01L 21/76834* (2013.01); *H01L 21/76844* (2013.01); *H01L 21/76846* (2013.01); *H01L 21/76849* (2013.01); *H01L 21/76897* (2013.01); *H01L 23/528* (2013.01); *H01L 23/5226* (2013.01); *H01L 23/5283* (2013.01); *H01L 23/5329* (2013.01); *H01L 23/53223* (2013.01); *H01L 23/53228* (2013.01); *H01L 23/53238* (2013.01); *H01L 23/53266* (2013.01); *H01L 23/53295* (2013.01); *H01L 21/76804* (2013.01); *H01L 2924/0002* (2013.01)

(56) References Cited

U.S. PATENT DOCUMENTS

| | | | |
|---|---|---|---|
| 5,891,513 | A | 4/1999 | Dubin |
| 5,935,868 | A | 8/1999 | Fang |
| 6,143,645 | A | 11/2000 | Hsu |
| 6,150,723 | A | 11/2000 | Harper |
| 6,153,833 | A | 11/2000 | Dawson |
| 6,157,081 | A | 12/2000 | Nariman |
| 6,455,937 | B1 | 9/2002 | Cunningham |
| 6,706,625 | B1 | 3/2004 | Sudijono |
| 7,086,138 | B2 | 8/2006 | Anderson |
| 7,517,736 | B2 | 4/2009 | Mehta |
| 7,528,066 | B2 | 5/2009 | Yang |
| 7,727,888 | B2 | 6/2010 | Yang |
| 7,790,599 | B2 | 9/2010 | Yang |
| 7,834,457 | B2 | 11/2010 | Yang |
| 7,846,834 | B2 | 12/2010 | Yang |
| 7,867,895 | B2 | 1/2011 | Yang |
| 7,964,966 | B2 | 6/2011 | Yang |
| 8,044,519 | B2 | 10/2011 | Watanabe |
| 8,232,196 | B2 | 7/2012 | Yang |
| 8,232,645 | B2 | 7/2012 | Yang |
| 8,247,030 | B2 | 8/2012 | Suzuki |
| 8,361,900 | B2 | 1/2013 | Pan et al. |
| 8,492,274 | B2 | 7/2013 | Yang |
| 9,349,691 | B2 | 5/2016 | Murray |
| 9,859,160 | B2 | 1/2018 | Murray |
| 9,953,869 | B2 | 4/2018 | Murray |
| 10,035,978 | B2 | 7/2018 | Oie |
| 2001/0030366 | A1* | 10/2001 | Nakano ............ H01L 21/76835 257/758 |
| 2002/0121699 | A1 | 9/2002 | Cheng |
| 2004/0238961 | A1 | 12/2004 | Cunningham |
| 2006/0194430 | A1 | 8/2006 | Beck |
| 2006/0205204 | A1 | 9/2006 | Beck |
| 2007/0246792 | A1 | 10/2007 | Yang |
| 2009/0098728 | A1 | 4/2009 | Grunow |
| 2009/0309226 | A1 | 12/2009 | Horak |
| 2010/0038783 | A1 | 2/2010 | Yang |
| 2010/0219529 | A1 | 9/2010 | Morrow |
| 2011/0006429 | A1 | 1/2011 | Liu et al. |
| 2012/0015517 | A1 | 1/2012 | Oshida |
| 2012/0068344 | A1 | 3/2012 | Bonilla |
| 2013/0334700 | A1 | 12/2013 | Singh |
| 2016/0027738 | A1 | 1/2016 | Murray |
| 2016/0197010 | A1 | 7/2016 | Murray |
| 2016/0204069 | A1 | 7/2016 | Murray |
| 2018/0174903 | A1 | 6/2018 | Murray |

OTHER PUBLICATIONS

Murray et al., "Semiconductor Device With Reduced via Resistance", U.S. Appl. No. 16/689,223, filed Nov. 20, 2019, 24 pages.

"Sacrificial Liner for Contact Gouge Feature in Cu Integration", Authors et. al.: Disclosed Anonymously, IP.com No. IPCOM000194955D, IP.com Electronic Publication: Apr. 15, 2010, pp. 1-5.

IBM, "Noble Metal Cap for BEOL Applications", Original Publication Date: Apr. 4, 2007, IP.com No. IPCOM000149688D, IP.com Electronic Publication: Apr. 4, 2007, p. 1-8.

Usui et al., "High Performance Ultra Low-k (k=2.0/keff=2.4)/Cu Dual-Damascene Interconnect Technology with Self-Formed MnSixOy Barrier Layer for 32 nm-node", 1-4244-0103-8/06 © 2006 IEEE, pp. 216-218.

Usui et al., "Highly Reliable Copper Dual-Damascene Interconnects With Self-Formed MnSixOy Barrier Layer", IEEE Transactions on Electron Devices, vol. 53, No. 10, Oct. 2006, 0018-9383, © 2006 IEEE, Digital Object Identifier 10.1109/TED.2006.882046, pp. 2492-2499.

Yang, "Enhanced Via Integration Process for Copper/Ultralow-k Interconnects", IEEE Electron Device Letters, vol. 31, No. 4, Apr. 2010, 0741-3106 © 2010 IEEE, pp. 347-349, Digital Object Identifier 10.1109/LED.2010.2040705.

* cited by examiner

SEMICONDUCTOR DEVICE WITH REDUCED VIA RESISTANCE

CROSS-REFERENCE TO RELATED APPLICATIONS

This patent application is a continuation of U.S. application Ser. No. 15/897,526, filed Feb. 15, 2018, now U.S. Pat. No. 10,553,483, issued Feb. 4, 2020, which is a continuation of U.S. application Ser. No. 15/078,066, filed Mar. 23, 2016, now U.S. Pat. No. 9,953,869, issued Apr. 24, 2018, which is a divisional of U.S. application Ser. No. 14/339,704, filed Jul. 24, 2014, now U.S. Pat. No. 9,349,691, issued Nov. 15, 2018, each of which are incorporated by reference herein in their entirety.

BACKGROUND OF THE INVENTION

The present invention relates generally to semiconductor devices, and more particularly to copper interconnects and methods of their fabrication.

Manufacture of a semiconductor device is normally divided into two major phases. The "front end of the line" (FEOL) is dedicated to the creation of all the transistors in the body of the semiconductor device, and the "back end of the line" (BEOL) creates the metal interconnect structures, which connect the transistors to each other as well as provide power to the devices. The FEOL consists of a repeated sequence of steps that modifies the electrical properties of part of a wafer surface and grows new material above selected regions. Once all active components are created, the second phase of manufacturing (BEOL) begins. During the BEOL, metal interconnects are created to establish the connection pattern of the semiconductor device.

Semiconductor devices generally include a plurality of circuits which form an integrated circuit fabricated on a semiconductor substrate. To improve the performance of the circuits, low k dielectric materials, having a dielectric constant of less than silicon dioxide, are used between circuits as inter-layer dielectric (ILD) to reduce capacitance. Interconnect structures made of metal lines or metal vias are usually formed in and around the ILD material to connect elements of the circuits. Within a typical interconnect structure, metal lines run parallel to the semiconductor substrate, while metal vias run perpendicular to the semiconductor substrate. An interconnect structure may consist of multi-level or multilayered schemes, such as, single or dual damascene wiring structures.

There are many failure mechanisms that affect the reliability of an integrated circuit. Time Dependent Dielectric Breakdown (TDDB) is a failure mechanism where the dielectric material of the ILD breaks down as a result of long-time application of electrical stresses, such as high current density. The breakdown leads to formation of a conducting path through the dielectric material and between metal interconnects via surface diffusion of the metal interconnect structures, i.e., wires and vias. In time, the conducting path will form a short between interconnect structures causing a failure.

SUMMARY

A first embodiment of the present invention discloses a semiconductor interconnect structure comprising: a first electrically conductive structure of a first interconnect level, the first electrically conductive structure having a plurality of bottom portions; a dielectric capping layer, at least a portion of the dielectric capping layer being horizontally planar with and in contact with a first bottom portion of the plurality of bottom portions, the portion of the dielectric capping layer being between the first interconnect level and a second interconnect level that is below the first interconnect level; a second electrically conductive structure in the second interconnect level, the second electrically conductive structure being in electrical contact with a second bottom portion of the plurality of bottom portions, the second bottom portion being vertically offset with the first bottom portion such that the second bottom portion is closer to the second electrically conductive structure than the first bottom portion; and a portion of liner material separating, at least in part, the second bottom portion of the first electrically conductive structure from the second electrically conductive structure.

DETAILED DESCRIPTION

Figure 1:
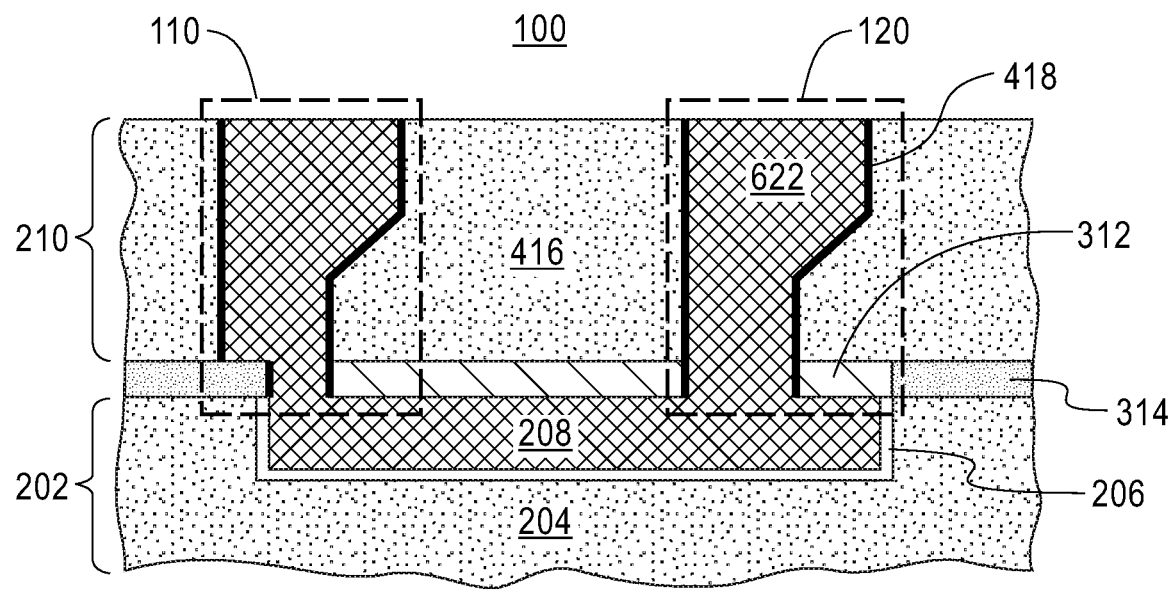
FIG. 1 illustrates a cross-sectional view of a semiconductor device containing a back-end-of-line (BEOL) metal interconnect, in accordance with an embodiment of the present invention.

Embodiments, in accordance with the present invention, recognize that metal via resistance increases with technology as the size of component features shrink. The combination of materials, and electrical properties of the materials used in fabrication of "back end of the line" (BEOL) metal interconnects creates vias with higher resistance as the size of the structural elements decrease. Metal via resistance is a combination of the resistance associated with the bulk metal, the sidewall metal, and the liner material within the metal via. Embodiments recognize that the portion of via resistance from the high resistivity liner material dominates the portion of via resistance from either the bulk metal, or the sidewall metal within the metal via. Embodiments provide a fabrication process for a metal interconnect which selectively removes the liner material at the bottom of a metal via.

Removal of the high resistivity liner material at the bottom of the metal via reduces the resistance of the electrical connection between the metal via and a metal wiring landing pad.

An alternate embodiment provides a fabrication process for a metal interconnect which selectively removes the liner material at the bottom of a metal via, and replaces or adds to the original liner material with a second liner material with lower resistivity. In some embodiments, the second liner material includes conductive materials with low resistivity which provide for wettability at the bottom of the metal via during plating to prevent defects from voiding at the bottom.

Embodiments recognize that misalignment of the metal via to the metal wiring landing pad is a byproduct of registration tolerances in patterning during the fabrication process, and the opportunity for such misalignment will increase with technology as the size of component features shrink. In some embodiments, in the case of a partially landed metal via, the via is not be completely surrounded by a diffusion barrier material due to non-selectivity of a dielectric capping layer formed directly above the metal wiring landing pad. In some scenarios, without a selective diffusion barrier, ions of the bulk metal diffuse over time into the inter-layer dielectric (ILD) layer causing an electrical short due to Time Dependent Dielectric Breakdown (TDDB). Embodiments, in accordance with the present invention, provide a diffusion barrier or capping layer comprised of a dielectric component, and a metal component.

Embodiments define an interconnect structure with a bottom conductive layer, an insulating dielectric layer, a metal capping layer, and a metal conductive via, where the conductive via and bottom conductive layer are electrically connected. Fabrication methods are disclosed for etching the metal liner material from the bottom of the metal via. Reduced TDDB defects combined with reduced resistance of interconnects offer the potential to deliver superior performance and reliability for semiconductor applications in electronic devices.

Embodiments generally provide a metal interconnect between a metal wire and a metal via with reduced resistance surrounded by a diffusion barrier permitting reproducible and manufacturable designs. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the Figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "on", "over", "overlying", "atop", "positioned on", or "positioned atop" mean that a first element, such as a first structure, is present on a second element, such as a second structure, wherein intervening elements, such as an interface structure may be present between the first element and the second element. The terms "direct contact", "directly on", or "directly over" mean that a first element, such as a first structure, and a second element, such as a second structure, are connected without any intermediary conducting, insulating or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Referring now to the Figures, FIG. 1 illustrates a cross-sectional view of a semiconductor device containing a back-end-of-line (BEOL) metal interconnect, i.e. interconnect structure 100, in accordance with an embodiment of the present invention. Interconnect structure 100 includes lower interconnect level 202 and upper interconnect level 210 which are separated, in part, by a capping layer comprised of metal capping layer 312 and dielectric capping layer 314. In this embodiment, lower interconnect level 202 is located above a semiconductor substrate (not shown) including one or more semiconductor front-end-of-line (FEOL) devices. Lower interconnect level 202 includes dielectric layer 204, and an embedded conductor comprised of liner material 206, and conductive material 208. Liner material 206 acts as a diffusion barrier separating conductive material 208 from dielectric layer 204. As such, together, liner material 206 and conductive material 208 constitute an electrically conductive structure embedded in dielectric layer 204. Upper interconnect level 210 includes a second dielectric layer, i.e., dielectric layer 416, which has two via openings located therein for via 110, and via 120. The two via openings for vias 110 and 120, each expose a portion of conductive material 208 in lower interconnect level 202. The two via openings for vias 110 and 120 are filled with liner material 418 and conductive material 622, which forms an electrical connection between lower interconnect level 202 and upper interconnect level 210. As such, vias 110 and 120 are seen as a type of electrically conductive structures. Liner material 418 acts as a diffusion barrier separating conductive material 622 from dielectric layer 416. Although the structure shown in FIG. 1 illustrates an interconnect having two vias, other embodiments include any number of such vias in dielectric layer 416. In some embodiments, one or more such vias expose other conductive regions embedded in dielectric layer 204.

In accordance with an embodiment of the present invention, interconnect structure 100 includes a partially landed via, via 110, above conductive material 208. Via 110 is partially landed on conductive material 208 such that only a portion of the bottom via surface is directly on conductive material 208. A second portion of the bottom via surface of via 110 is directly on dielectric capping layer 314. A first portion of the sidewall of via 110 is connected to dielectric capping layer 314, and a second portion of the sidewall of via 110 is connected to metal capping layer 312. In some embodiments, the sidewall of via 110 include liner material 418. Both metal capping layer 312 and dielectric capping layer 314 act as a diffusion barrier separating conductive materials 208 and 622 from dielectric layers 204 and 416. In other words, both metal capping layer 312 and dielectric capping layer 314 inhibit the migration of metals or other elements from conductive materials 208 and 622 to dielectric layers 204 and 416.

In accordance with an embodiment of the present invention, both vias 110 and 120 are constructed with portions of metal liner material 418 selectively removed from the bottom of each via. In some embodiments, portions of conductive material 208 directly under the removed portions of metal liner material 418 are selectively removed. In some embodiments, removal of a portion of conductive material 208 ensures that metal liner material 418 is completely removed. In some embodiments, removal of a portion of conductive material 208 results in a texturing of the bottom via surface to aid adhesion of conductive material 622. Conductive material 622 fills in vias 110 and 120, and directly contacts conductive material 208 to reduce or minimize via resistance. Removal of portions of metal liner material 418 provides a reduction in overall via resistance.

In some embodiments, above upper interconnect level 210 includes upper wiring layers (not shown), or escape wiring leading to the surface above interconnect structure 100. In some embodiments, such above the upper wiring layers, are protective layers (not shown), such as oxides, nitrides, and polyimide films, as are standard in semiconductor manufacture.

Figure 2:
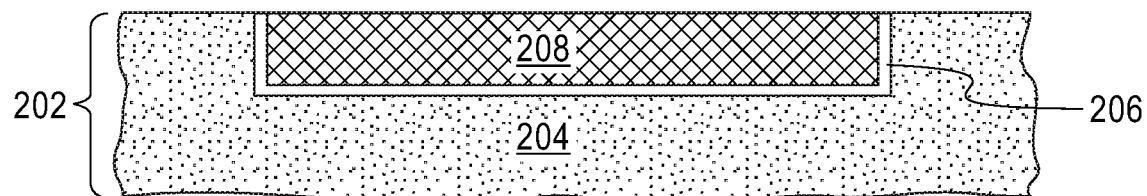
FIG. 2 is a cross-sectional view of a semiconductor device upon which the interconnect structure of FIG. 1 is be fabricated, in accordance with an embodiment of the present invention.

FIGS. 2-6 depict an embodiment for fabricating interconnect structure 100 with vias 110 and 120. FIG. 2 is a cross-sectional view of a semiconductor device upon which the interconnect structure of FIG. 1 is fabricated, in accordance with an embodiment of the present invention. In some embodiments, lower interconnect level 202 is located above a semiconductor substrate (not shown) including one or more semiconductor front-end-of-line (FEOL) devices. In some embodiments, the semiconductor substrate includes an electrically semiconducting material, an insulating material, a conductive material, devices, or structures made of these materials or any combination thereof (e.g., a lower level of an interconnect structure). In certain embodiments, the semiconductor substrate is comprised of a semiconducting material, such as Si, SiGe, SiGeC, SiC, Ge alloys, GaAs, InAs, InP, and other compound semiconductors, or organic semiconductors. In some embodiments, in addition to the above listed semiconducting materials, the semiconducting material includes a layered semiconductor, such as, for example, Si/SiGe, Si/SiC, SOIs, or silicon germanium-on-insulators (SGOIs). In some embodiments, these semiconductor materials form a device, devices, or structures, which are either discrete or interconnected, or a combination thereof.

In certain embodiments, the semiconductor substrate includes one or more semiconductor devices, such as complementary metal oxide semiconductor (CMOS) devices or other field effect transistors (FETs), strained silicon devices, carbon-based (carbon nanotubes and/or graphene) devices, phase-change memory devices, magnetic memory devices, magnetic spin switching devices, single electron transistors, quantum devices, molecule-based switches, and other switching or memory devices that can be part of an integrated circuit formed therein. In other embodiments, the semiconductor substrate includes an electrical insulating material, such as an organic insulator, an inorganic insulator, or a combination thereof. In some embodiments, the semiconductor substrate includes electrically conducting material, for example, polysilicon, an elemental metal, an alloy including at least one elemental metal, a metal silicide, a metal nitride, etc., or combinations thereof including multilayers.

In the illustrative example of FIG. 2, lower interconnect level 202 includes dielectric layer 204, and a conductor embedded therein comprised of liner material 206, and conductive material 208. In some embodiments, dielectric layer 204 of lower interconnect level 202 is any ILD layer including inorganic dielectrics or organic dielectrics, and is either porous or non-porous, or a combination thereof. Examples of suitable dielectrics include, but are not limited to, SiC, $Si_3N_4$, $SiO_2$, a carbon doped oxide, SiC(N,H), a low-K dielectric, or multilayers thereof. In some embodiments, dielectric layer 204 is formed over the surface of the semiconductor substrate using an appropriate deposition technique including, but not limited to, physical vapor deposition (PVD), plasma assisted chemical vapor deposition (PACVD), chemical vapor deposition (CVD), plasma enhanced chemical vapor deposition (PECVD), low pressure chemical vapor deposition (LPCVD), atomic layer deposition (ALD), chemical solution deposition (such as spin coating), or evaporation. In some embodiments, the thickness of dielectric layer 204 varies depending on the dielectric material used and the number of dielectric layers within lower interconnect level 202. For typical interconnect structures, dielectric layer 204 has a thickness from about 100 nm to 450 nm.

In some embodiments, conductive material 208 of lower interconnect level 202 forms a conductive region or feature embedded in dielectric layer 204. In some embodiments, the conductive region or feature is formed by conventional damascene patterning or subtractive etch patterning utilizing lithographic, etching, and deposition processes. For example, a photoresist layer is applied to the surface of dielectric layer 204. The photoresist layer is exposed to a desired pattern of radiation, and developed utilizing a conventional resist developer. The patterned photoresist layer is used as an etch mask to transfer the pattern into dielectric layer 204. The etched region of dielectric layer 204 is then filled with conductive material 208 to form the conductive region or feature. Conductive material 208 includes, but is not limited to, polysilicon, a conductive metal, an alloy of two or more conductive metals, a conductive metal silicide, or any combination of two or more of the foregoing materials. In some embodiments, conductive material 208 is comprised of one or more of Cu, Al, W, Ti, TiN, Cu alloy (such as AlCu), or any other useful conductive material or alloy(s). Conductive material 208 is deposited into the etched region of dielectric layer 204 using an appropriate deposition technique including, but not limited to, sputter deposition, ALD, CVD, PVD, PECVD, electrochemical deposition (ED), electroplating, or other deposition techniques. In some embodiments, after deposition, a conventional planarization process, such as chemical mechanical polishing (CMP), is used to provide a structure in which conductive material 208 has an upper surface that is substantially coplanar with the upper surface of dielectric layer 204.

Embodiments provide for separation of conductive material 208 from dielectric layer 204 by a diffusion barrier layer, such as liner material 206. In some embodiments, liner material 206 includes, but is not limited to, one or more of: Ta, TaN, Ti, TiN, Ru, RuTaN, RuTa, W, WN, or any other material that serves as a barrier to prevent a conductive material from diffusing into a dielectric material layer. In some embodiments, liner material 206 is formed by a deposition process including, but not limited to, ALD, CVD, PVD, PECVD, ED, sputtering, or plating. In some embodiments, liner material 206 also includes a bilayer or multilayer structure that includes a lower layer of a metallic nitride, such as TaN, and an upper metallic layer, such as Ta. In some embodiments, the thickness of liner material 206 varies depending on the exact means of the deposition process and the material employed. Typically liner material 206 has a thickness from about 4 nm to about 40 nm, with a thickness from about 7 nm to about 20 nm being more typical.

Figure 3A:
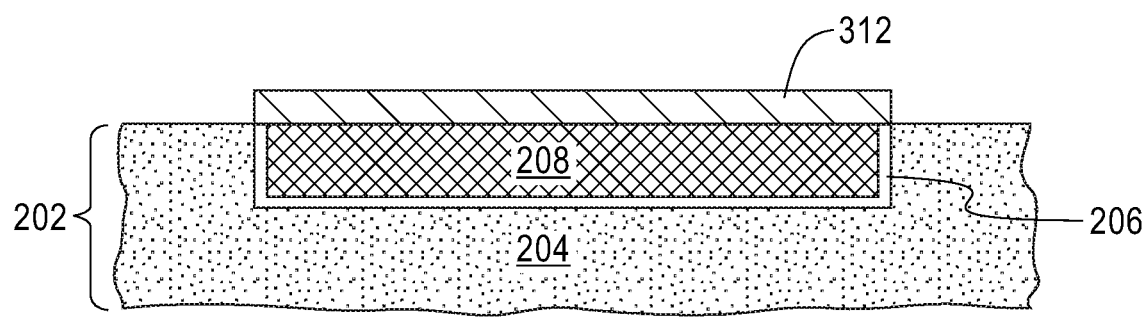
FIG. 3A depicts fabrication steps, in accordance with an embodiment of the present invention.

FIG. 3A depicts fabrication steps, in accordance with an embodiment of the present invention. After forming the at least one conductive feature comprising conductive material 208 within dielectric layer 204, a capping layer is selectively formed on the surface of conductive material 208 of lower interconnect level 202. Metal capping layer 312 is formed by a conventional deposition process including, but not limited to, CVD, ALD, or electroless plating. The various deposition conditions are optimized to provide selective deposition to the conductive surface of conductive material 208 without utilizing a mask. In some embodiments, metal capping layer 312 is any suitable metallic capping material including, but not limited to, Co, Ru, W, Ta, Ti, P, Rh, and any alloy or combination thereof. Metal capping layer 312 provides a diffusion barrier between conductive material 208 of lower interconnect level 202 and dielectric layer 416 of upper interconnect level 210, as shown in FIG. 1.

Figure 3B:
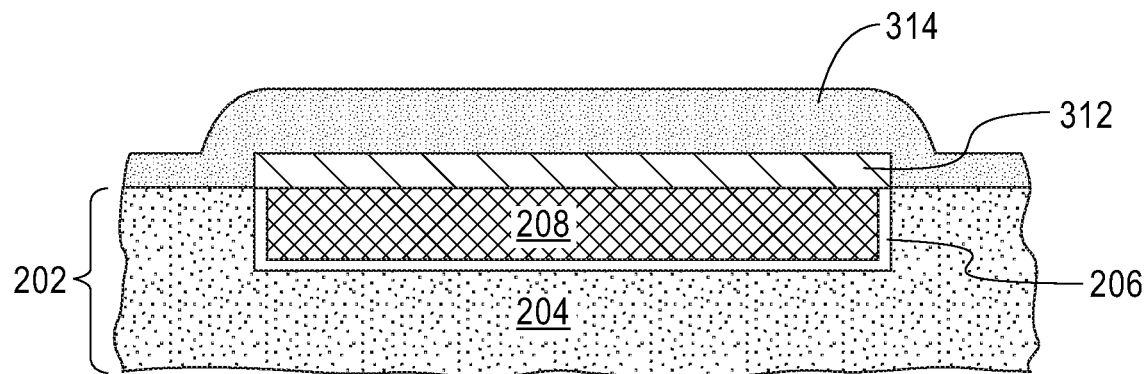
FIG. 3B depicts additional fabrication steps, in accordance with an embodiment of the present invention.

FIG. 3B depicts additional fabrication steps, in accordance with an embodiment of the present invention. After forming metal capping layer 312, a second capping material, dielectric capping layer 314 is blanket deposited over the surface of both dielectric layer 204 and metal capping layer 312. In some embodiments, dielectric capping layer 314 is deposited on dielectric layer 204 and metal capping layer 312 using an appropriate deposition technique (discussed above). In some embodiments, dielectric capping layer 314 is any suitable dielectric capping material including, but not limited to, SiC, $Si_4NH_3$, $SiO_2$, or multilayers thereof. Dielectric capping layer 314 provides a diffusion barrier between conductive material 622 of upper interconnect level 210, as depicted and described in FIG. 1, and dielectric layer 204 of lower interconnect level 202. Embodiments provide that dielectric capping layer 314 has a dielectric constant higher than dielectric layer 204 of lower interconnect level 202, and dielectric layer 416 of upper interconnect level 210, as depicted and described in FIG. 1.

Figure 3C:
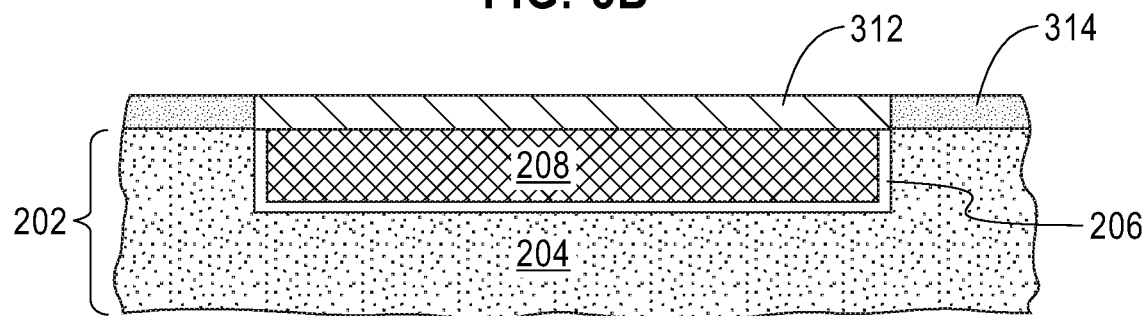
FIG. 3C depicts additional fabrication steps, in accordance with an embodiment of the present invention.

FIG. 3C depicts additional fabrication steps, in accordance with an embodiment of the present invention. In some embodiments, after deposition, a conventional planarization process, such as CMP, is used to provide a structure in which both metal capping layer 312 and dielectric capping layer 314 have an upper surface that is substantially coplanar with the upper surface of lower interconnect level 202. After CMP, metal capping layer 312 and dielectric capping layer 314 have a thickness from about 15 nm to about 55 nm, with a thickness from about 25 nm to about 45 nm being more typical. In some embodiments, the thickness of the capping layer materials varies depending on the exact means of the deposition process as well as the materials employed.

Figure 4A:
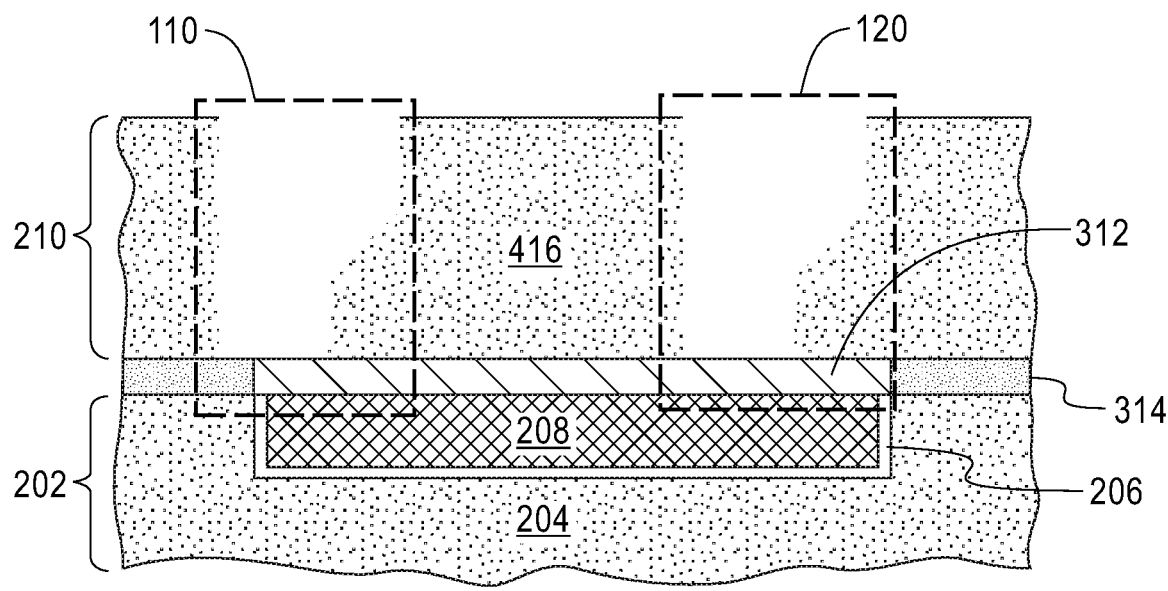
FIG. 4A depicts additional fabrication steps, in accordance with an embodiment of the present invention.

FIG. 4A depicts additional fabrication steps, in accordance with an embodiment of the present invention. Next, upper interconnect level 210 is formed by depositing dielectric layer 416 on the upper exposed surfaces of metal capping layer 312 and dielectric capping layer 314. In some embodiments, dielectric layer 416 is the same or different dielectric material as that of dielectric layer 204 of lower interconnect level 202. In some embodiments, dielectric layer 416 is comprise dielectric material including, but not limited to: SiC, $Si_3N_4$, $SiO_2$, a carbon doped oxide, SiC(N, H), a low-K dielectric, or multilayers thereof. In various embodiments, dielectric layer 416 is $Si_3N_4$ with a typical thickness of about 100 nm to 450 nm. A person of ordinary skill in the art will recognize that CMP steps may be inserted after the dielectric deposition process to planarize the surface of dielectric layer 416. In some embodiments, CMP utilizes a combination of chemical etching and mechanical polishing to smooth the surface and even out any irregular topography.

Using a conventional lithography process, an etch mask (not shown) is deposited over dielectric layer 416, and then patterned to create openings in the etch mask. The openings define at least two portions of dielectric layer 416 to be removed, which form openings for vias 110 and 120 of upper interconnect level 210, in accordance with an embodiment of the present invention. FIG. 4A illustrates vias 110 and 120 with an outline surrounding the via openings in dielectric layer 416. Dielectric layer 416 is etched down to metal capping layer 312 and dielectric capping layer 314 forming vias 110 and 120 therein. A portion of the top surface of metal capping layer 312 and a portion of the top surface of dielectric capping layer 314 are exposed at the bottom of via 110. A second portion of the top surface of metal capping layer 312 is exposed at the bottom of via 120. In some embodiments, the etching used in transferring the via pattern comprises a dry etching process, a wet chemical etching process or a combination thereof. The term "dry etching" is used herein to denote an etching technique such as reactive-ion etching (ME), ion beam etching, plasma etching, or laser ablation. In the illustrative embodiment, vias 110 and 120 are formed by employing an ME process. RIE uses chemically reactive plasma, generated by an electromagnetic field, to remove various materials. A person of ordinary skill in the art will recognize that the type of plasma used will depend on the material being removed. In some embodiments, the patterned etch mask is not removed at this point. In other embodiments, the patterned etch mask is removed at this point.

Figure 4B:
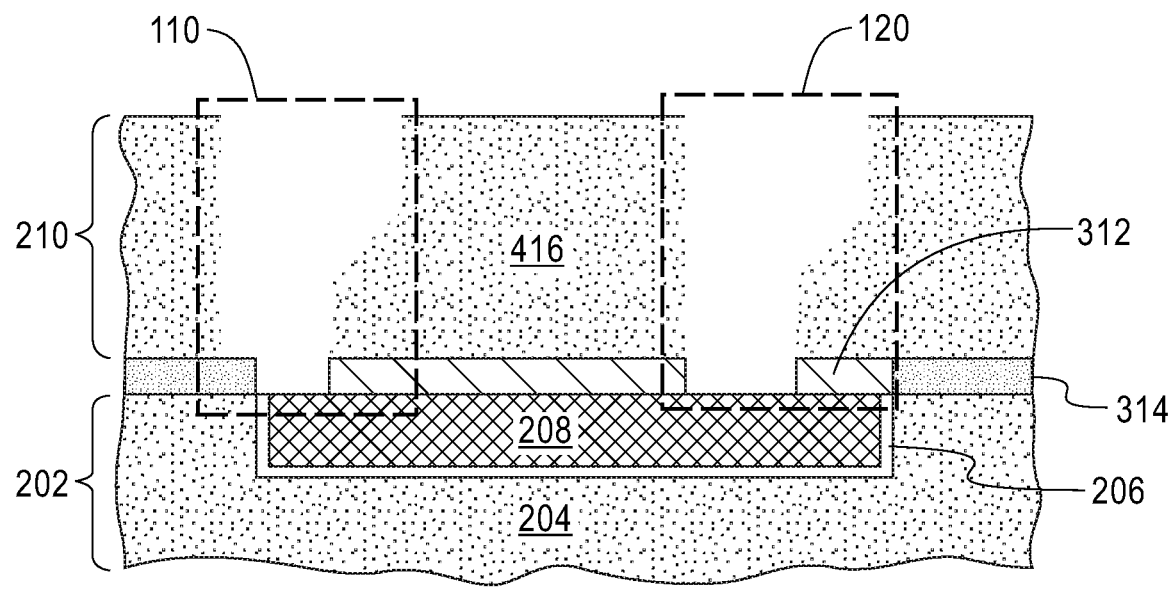
FIG. 4B depicts additional fabrication steps, in accordance with an embodiment of the present invention.

FIG. 4B depicts additional fabrication steps, in accordance with an embodiment of the present invention. Using a conventional etching process, one or more portions of metal capping layer 312 are exposed at the bottom of vias 110 and 120. Such etching continues until at least a part of the openings for vias 110 and 120 have reached conductive material 208. As such, post etching, metal capping layer 312 is covering only a portion of the top-most surface of conductive material 208 In some embodiments, the etching used to remove the one or more portions of metal capping layer 312 comprise a dry etching process, a wet chemical etching process or a combination thereof. Methods are employed that selectively etch metal surfaces, such as metal capping layer 312, and do not substantially etch the surrounding dielectric, such as dielectric layers 204 and 416, and dielectric capping layer 314. A metal etch process that is selective to etching metal capping layer 312, and not etching the underlying conductive material 208 is employed. For example, when removing metal capping layer 312 comprising one of Co, Ti, and CoWP, the wet etch process comprises two etchants. A first etchant comprises a dilute nitric acid solution with typical concentrations of 20 to 60 percent volume per volume (% v/v). A second etchant comprises a mixture of hydrogen peroxide with typical concentrations of 3 to 15 percent weight per weight (% w/w), and a quaternary ammonium compound with typical concentrations of 0.2 to 1.5% w/w.

Figure 4C:
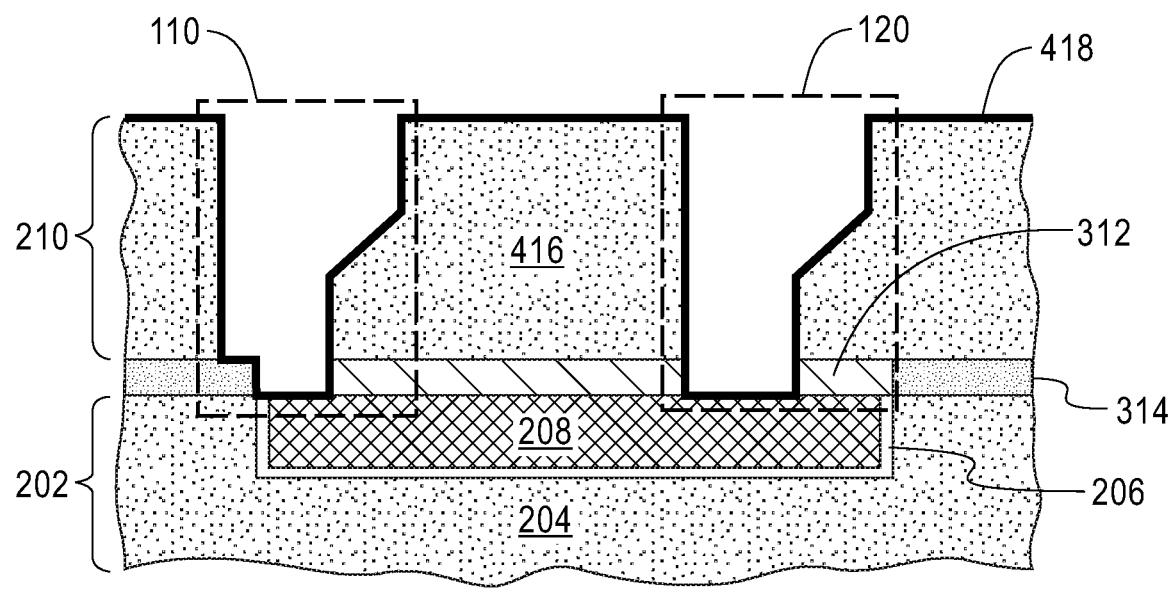
FIG. 4C depicts additional fabrication steps, in accordance with an embodiment of the present invention.

FIG. 4C depicts additional fabrication steps, in accordance with an embodiment of the present invention. In some embodiments, liner material 418 is deposited on the exposed portions of dielectric layer 416, such as the top surface and the sidewalls of vias 110 and 120, the exposed portions of conductive material 208 and liner material 206 at the bottom of vias 110 and 120, the exposed portions of dielectric capping layer 314 at the bottom of via 110, and the exposed sidewall portions of metal capping layer 312 in vias 110 and 120. In some embodiments, liner material 418 includes, but is not limited to, Ta, TaN, Ti, TiN, Ru, RuN, RuTa, RuTaN, W, WN, Co, CoW, Mn, MnO, a combination comprising two or more of the foregoing materials, or any other material that serves as a barrier to prevent a conductive material from diffusing through a dielectric material. Combinations of these materials are also contemplated to form a multilayered stacked diffusion barrier layer. Liner material 418 is formed utilizing an appropriate deposition technique, such as ALD, CVD, PECVD, PVD, sputtering, chemical solution deposition, or plating. In some embodiments, the thickness of liner material 418 varies depending on the number of material layers within the barrier layer, the technique used in forming the same, as well as the material of the diffusion barrier layer itself. In various embodiments, liner material 418 is Ta with a typical thickness of about 5 nm to about 50 nm.

Figure 5:
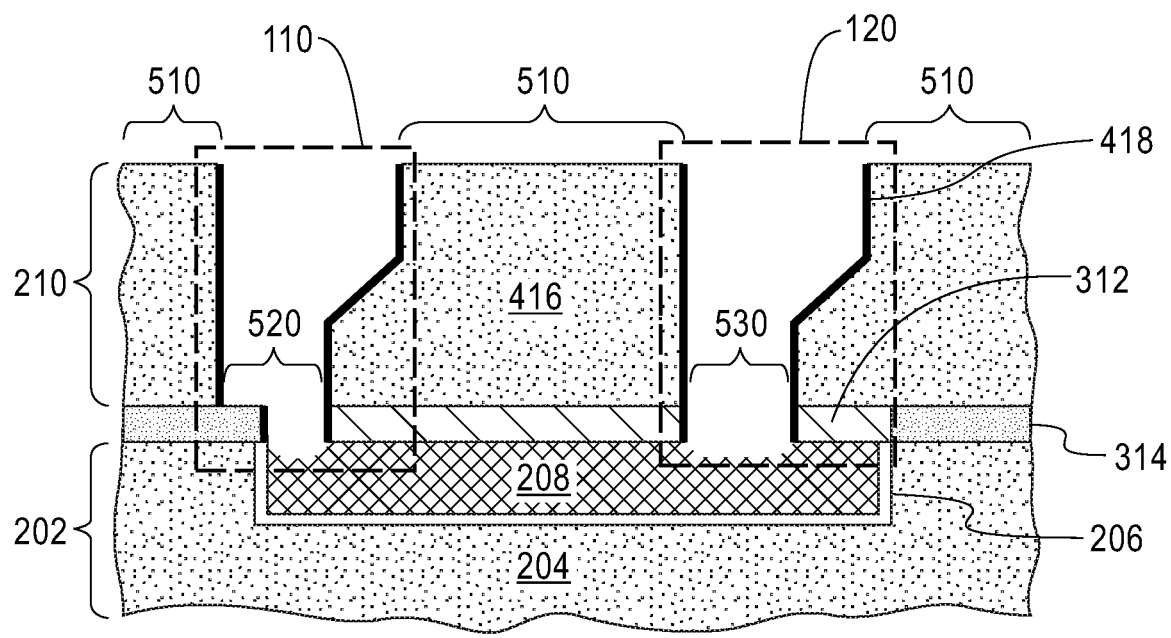
FIG. 5 depicts additional fabrication steps, in accordance with an embodiment of the present invention.

FIG. 5 depicts additional fabrication steps, in accordance with an embodiment of the present invention. In one embodiment, horizontal portions of liner material 418 are selectively removed from locations 510, 520, and 530. Location 510 indicates portions of liner material 418 above the top surface of dielectric layer 416 that have been removed. Location 520 indicates portions of liner material 418 above the top surface of dielectric capping layer 314 and conductive material 208 that have been removed, thereby exposing portions of dielectric capping layer 314 and conductive material 208 at the bottom of via 110. Turning now to the discussion of the elements seen in both FIGS. 5 and 6, the portions of liner material 418 that have been removed from location 520 become the location where the two bottom portions of via 110 come into contact with dielectric capping layer 314 and conductive material 208. As such, the bottom portions of via 110 are seen to be in contact with a portion of dielectric capping layer 314 and a top surface of conductive material 208 that have been exposed. Therefore, a bottom portion of via 110 is located over a portion of dielectric capping layer 314, while another bottom portion of via 110 is in electrical contact with conductive material 208.

Returning now to the discussion of FIG. 5, location 530 includes portions of liner material 418 above the top surface of the exposed portion of conductive material 208 at the bottom of via 120. The selective removing process includes, but is not limited to, an ion-sputtering process with a gas resource including, but not limited to: Ar, He, Xe, Ne, Kr, Rn, N2 or H2. The ion-sputtering process is the removal of material by atom bombardment, and works by line of sight allowing the horizontal surfaces to be removed and leaving the vertical surfaces with minimal sidewall removal. For example, an Ar sputtering process is utilized to selectively remove portions of liner material 418 using a conventional Ar sputtering process that is used in interconnect technology.

In some embodiments, subsequent to the removal of the portions of liner material 418, the etching process removes a portion of the exposed metal from the surface of conductive material 208, thereby producing a new exposed metal surface at a position below the level of dielectric layer 204 and to provide better adhesion of conductive material 622 to the surface of conductive material 208, as shown in at least FIGS. 6 and 7. Processes for etching the metal, however, should not roughen the metal surface so much as to create pits or cavities deep enough to retain pockets of moisture during subsequent process operations.

Figure 6:
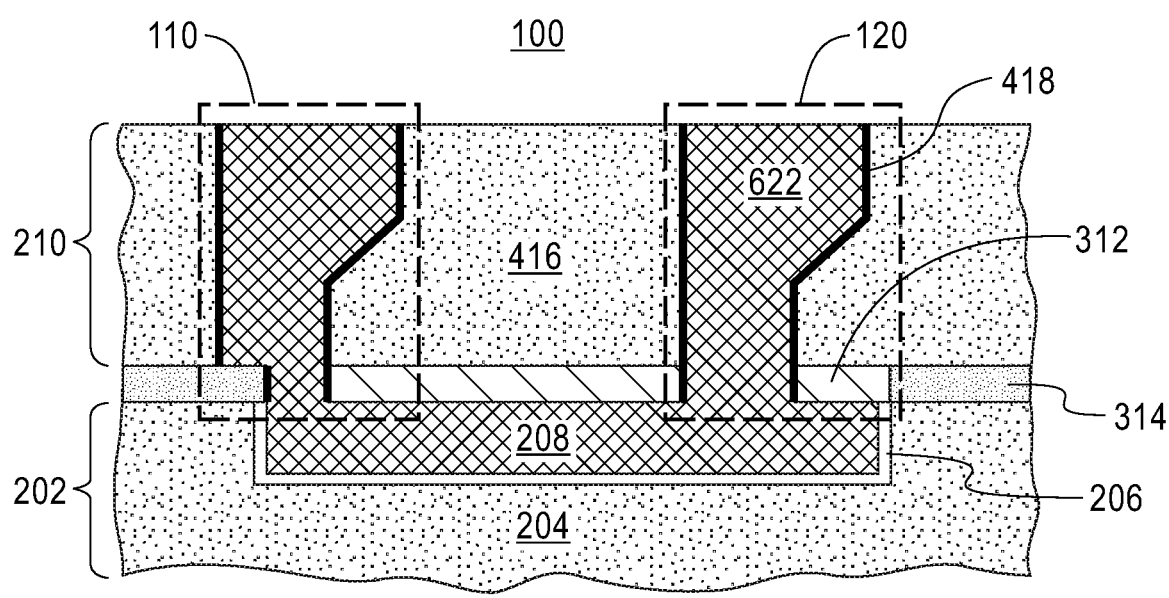
FIG. 6 depicts additional fabrication steps, in accordance with an embodiment of the present invention.

FIG. 6 depicts additional fabrication steps, in accordance with an embodiment of the present invention. In some embodiments, conductive material 622 is formed over the sidewalls and bottoms of vias 110 and 120, as well as the surface of dielectric layer 416 using CVD, or other appropriate deposition techniques (discussed above). In some embodiments, conductive material 622 comprises the same or different conductive material as that of conductive material 208. In some embodiments, conductive material 622 comprises a metal or metal alloy including, but not limited to, Cu, Al, W, Ti, Ta, alloys, or any other useful conductive material or combinations thereof. Conductive material 622, liner material 206, and conductive material 208 are chosen to minimize electrical resistance between them. In one embodiment, conductive material 622 is deposited as plated Cu. In some embodiments, in the case of plated Cu, an initial seed or catalyst layer is deposited prior to plating. The optional seed layer is comprised of a metal or metal alloy including, but not limited to, Ru, TaRu, TaN, Ir, Rh, Pt, Pd, Co, Cu and alloys thereof. In some embodiments, the deposition is followed by a CMP process to remove excess conductive material 622 and liner material 418 above the surface of dielectric layer 416, and to confine conductive material 622 to vias 110 and 120 formed in dielectric layer 416.

Additional wiring layers (not shown) are fabricated above interconnect structure 100 using conventional damascene patterning or subtractive etch patterning utilizing lithographic, etching and deposition processes such that no further explanation is required herein for those of skill in the art to understand the invention. One skilled in the art will recognize that additional cleaning processes may be necessary before creating the additional wiring layers. In some embodiments, a passivation layer, a dielectric capping layer, or a protective coating, such as SiN or $SiO_2$, is deposited (not shown) on surface wires (not shown) to protect the metal surface from environmental conditions. In some embodiments, a polyimide layer is deposited (not shown) on top of the passivation layer with openings for solder connections.

Figure 7:
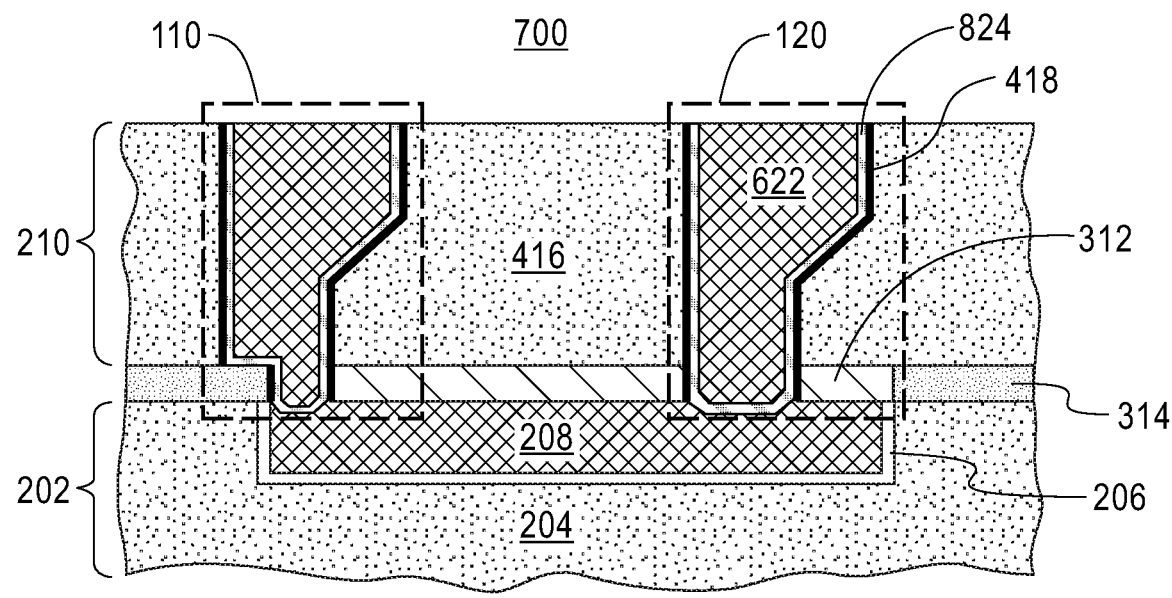
FIG. 7 illustrates a cross-sectional view of a semiconductor device containing a back-end-of-line (BEOL) metal interconnect with a second liner, in accordance with an embodiment of the present invention.

FIG. 7 illustrates a cross-sectional view of a semiconductor device containing a back-end-of-line (BEOL) metal interconnect with a second liner, in accordance with an embodiment of the present invention. Interconnect structure 700 includes lower interconnect level 202 and upper interconnect level 210 which are separated, in part, by a capping layer comprised of metal capping layer 312 and dielectric capping layer 314. In some embodiments, lower interconnect level 202 is located above a semiconductor substrate (not shown) including one or more semiconductor front-end-of-line (FEOL) devices. Lower interconnect level 202 includes dielectric layer 204, and an embedded conductor comprised of liner material 206, and conductive material 208. Liner material 206 acts as a diffusion barrier separating conductive material 208 from dielectric layer 204. Upper interconnect level 210 includes a second dielectric layer, i.e., dielectric layer 416, which has two via openings located therein for via 110, and via 120. The two via openings for vias 110 and 120, each expose a portion of conductive material 208 in lower interconnect level 202. The two via openings for vias 110 and 120 are filled with liner material 418, liner material 824, and conductive material 622, which forms an electrical connection between lower interconnect level 202 and upper interconnect level 210. Liner material 418 acts as a diffusion barrier separating conductive material 622 from dielectric layer 416. Although the structure shown in FIG. 7 illustrates an interconnect having two vias, in other embodiments, any number of such vias in dielectric layer 416 exist. In such embodiments, certain of those vias expose other conductive regions embedded in dielectric layer 204.

In accordance with an embodiment of the present invention, interconnect structure 700 includes a partially landed via, via 110, above conductive material 208. Via 110 is partially landed on conductive material 208 such that only a portion of the bottom via surface is directly on conductive material 208. A second portion of the bottom via surface of via 110 is directly on dielectric capping layer 314. A first portion of the sidewall of via 110 is connected to dielectric capping layer 314, and a second portion of the sidewall of via 110 is connected to metal capping layer 312. In some embodiments, the sidewall of via 110 includes liner material 418. Both metal capping layer 312 and dielectric capping layer 314 act as a diffusion barrier separating conductive materials 208 and 622 from dielectric layers 204 and 416.

In accordance with an embodiment of the present invention, both vias 110 and 120 are constructed with portions of metal liner material 418 selectively removed from the bottom of each via. In some embodiments, portions of conductive material 208 directly under the removed portions of metal liner material 418 are selectively removed. In some embodiments, removal of a portion of conductive material 208 ensures that metal liner material 418 is completely removed. In some embodiments, removal of a portion of conductive material 208 textures the bottom via surface to aid the adhesion of conductive material 622. Conductive material 622 fills in vias 110 and 120, and directly contacts conductive material 208 to reduce or minimize via resistance. Removal of portions of metal liner material 418 provides a reduction in overall via resistance.

In accordance with an alternate embodiment of the present invention, both vias 110 and 120 are constructed with a low resistivity wetting layer comprised of liner material 824. In various embodiments, liner material 824 serves as a wetting agent for reducing voiding during deposition of conductive material 622, and has the property of low resistivity which reduces the overall via resistance of vias 110 and 120. The layer comprising liner material 824 visible on the bottom surface of vias 110 and 120 above conductive material 208 as illustrated in FIG. 7 is a unique structural signature identifying the fabrication method used for making interconnect structure 700.

In some embodiments, above upper interconnect level 210 include upper wiring layers (not shown), or escape wiring leading to the surface above interconnect structure 700. In some embodiments, above the upper wiring layers, there are protective layers (not shown), such as oxides, nitrides, and polyimide films, as are standard in semiconductor manufacture.

Figure 8:
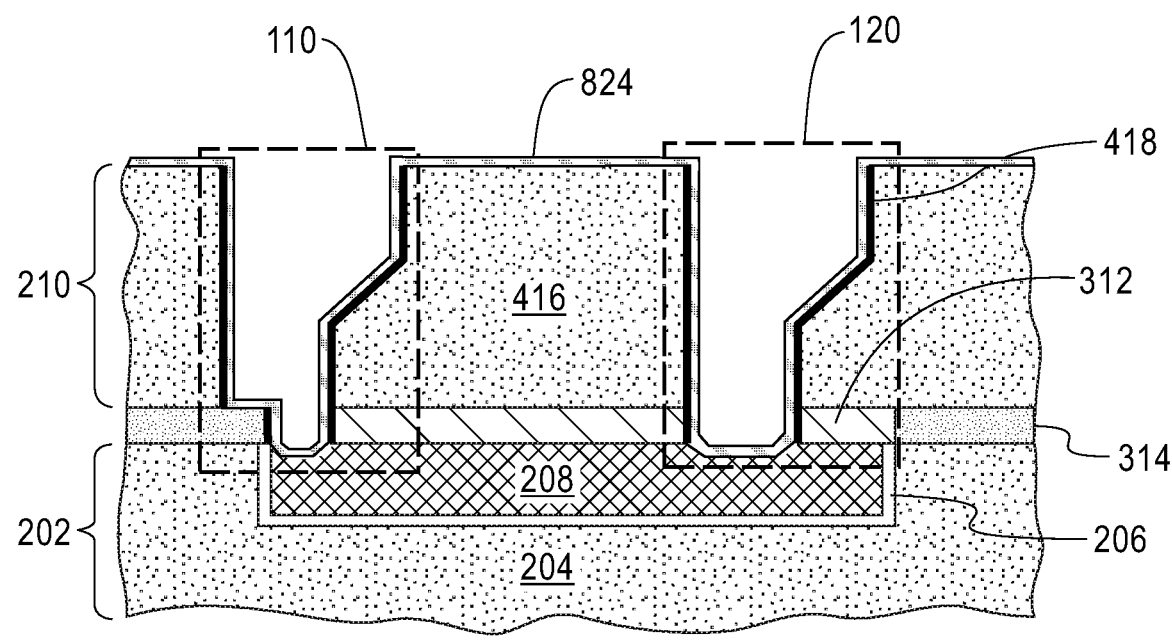
FIG. 8 depicts additional fabrication steps, in accordance with an embodiment of the present invention.

FIG. 8 depicts additional fabrication steps, in accordance with an embodiment of the present invention. In some embodiments, subsequent to the etching of liner material 418 as depicted and described in further detail with respect to FIG. 5, liner material 824 is deposited on the exposed portions of the top surface of dielectric layer 416, the exposed portions of conductive material 208 at the bottom of vias 110 and 120, the exposed portion of liner material 206 at the bottom of via 110, the exposed portions of dielectric capping layer 314 at the bottom of via 110, and the exposed sidewall portions of liner material 418 in vias 110 and 120. In some embodiments, liner material 824 includes, but is not limited to, Cu, Ru, Co, or a combination comprising two or more of the foregoing materials, or any other material that serves as a wetting agent for reducing voiding during deposition of conductive material 622 (shown and described in at least FIGS. 6 and 7), and has the property of low resistivity, typically less than 100 micro-ohm centimeters. Liner material 824 is formed utilizing an appropriate deposition technique, such as ALD, CVD, PECVD, or PVD. In various embodiments, liner material 824 is Co with a typical thickness of about 5 nm to about 50 nm. The layer comprising liner material 824 visible on the bottom surface of vias 110 and 120 above conductive material 208 as illustrated in FIG. 8 is a unique structural signature identifying the fabrication method used for making interconnect structure 700.

Having described embodiments for a metal interconnect comprised of a via with reduced resistance and methods of fabrication removing the metal liner at the bottom of the via (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

In certain embodiments, the method as described above is used in the fabrication of integrated circuit chips. The fabrication steps described above may be included on a semiconductor substrate consisting of many devices and one or more wiring levels to form an integrated circuit chip.

The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed:

1. A semiconductor interconnect structure comprising:
   a first electrically conductive structure of a first interconnect level, the first electrically conductive structure having a plurality of bottom portions;
   a dielectric capping layer, at least a portion of the dielectric capping layer being horizontally planar with and in contact with a first bottom portion of the plurality of bottom portions, the portion of the dielectric capping layer being between the first interconnect level and a second interconnect level that is below the first interconnect level;

a second electrically conductive structure in the second interconnect level, the second electrically conductive structure being in electrical contact with a second bottom portion of the plurality of bottom portions, the second bottom portion being vertically offset with the first bottom portion such that the second bottom portion is closer to the second electrically conductive structure than the first bottom portion; and a portion of liner material separating, at least in part, the second bottom portion of the first electrically conductive structure from the second electrically conductive structure.

2. The semiconductor interconnect structure of claim 1, further comprising:

a first dielectric layer located over a capping layer, the first dielectric layer having the first electrically conductive structure embedded therein, wherein the first electrically conductive structure includes a first liner material on one or more sidewalls of the first electrically conductive structure, and wherein the first electrically conductive structure is in electrical contact with at least one portion of a top surface of the second electrically conductive structure;

a second dielectric layer having the second electrically conductive structure embedded therein; and the capping layer being located over the second dielectric layer, the capping layer comprising at least one portion of a metal capping layer and the at least a portion of the dielectric capping layer, wherein the metal capping layer is located over at least a portion of the second electrically conductive structure, and wherein the dielectric capping layer is located over at least a portion of the second dielectric layer.

3. The semiconductor interconnect structure of claim 2, wherein the metal capping layer comprises at least one layer comprising one or more of: Co, Ru, W, Ta, Ti, P, and Rh.

4. The semiconductor interconnect structure of claim 2, wherein the dielectric capping layer comprises a dielectric material that inhibits metal diffusion between the first electrically conductive structure and the first dielectric layer.

5. The semiconductor interconnect structure of claim 2, further comprising:

a low resistivity contact between the second bottom surface and at least one portion of a top surface of the second electrically conductive structure, wherein the second bottom portion of the plurality of bottom portions is within an opening through the metal capping layer and the first liner material.

6. The semiconductor interconnect structure of claim 2, wherein the first electrically conductive structure further comprises a second liner material located over at least a portion of one or both of the first liner material and the dielectric capping layer, and is in contact with the top surface of the second electrically conductive structure.

7. The semiconductor interconnect structure of claim 6, wherein the second liner material comprises at least one layer comprising a conductive material with low resistivity including one or more of: Cu, Co, and Ru.

8. The semiconductor interconnect structure of claim 7, wherein low resistivity is defined as resistivity less than 100 micro-ohm centimeters.

9. The semiconductor interconnect structure of claim 1, wherein the dielectric capping layer comprises at least one layer including one or more of: SiC, $Si_4NH_3$, and $SiO_2$.

10. The semiconductor interconnect structure of claim 1, wherein one or both of the first electrically conductive structure and the second electrically conductive structure comprise Cu.

\* \* \* \* \*